United States Patent [19]
Lu et al.

[11] Patent Number: 5,595,928
[45] Date of Patent: Jan. 21, 1997

[54] HIGH DENSITY DYNAMIC RANDOM ACCESS MEMORY CELL STRUCTURE HAVING A POLYSILICON PILLAR CAPACITOR

[75] Inventors: Chih-Yuan Lu; Horng-Huei Tseng, both of Hsin Chu, Taiwan

[73] Assignee: Vanguard International Semiconductor Corporation, Hsin-Chu, Taiwan

[21] Appl. No.: 529,637

[22] Filed: Sep. 18, 1995

[51] Int. Cl.⁶ .............................. H01L 21/70; H01L 27/00
[52] U.S. Cl. ................... 437/52; 437/60; 437/919
[58] Field of Search ...................... 437/52, 60, 919, 437/47

[56] References Cited

U.S. PATENT DOCUMENTS

| | | | |
|---|---|---|---|
| 5,185,282 | 2/1993 | Lee | 437/47 |
| 5,284,787 | 2/1994 | Ahn | 437/52 |
| 5,332,685 | 7/1994 | Park et al. | 437/52 |
| 5,521,112 | 5/1996 | Tseng | 437/52 |

*Primary Examiner*—Jey Tsai
*Attorney, Agent, or Firm*—George O. Saile

[57] ABSTRACT

A method for manufacturing an array of stacked capacitor is described that utilizes the sidewall of the capacitor node contact to increase the capacitance on a dynamic random access memory (DRAM) cell. The area occupied by the stacked capacitor is also restricted to the area over the FET source/drain area, thereby providing for the further reduction of the cell size. The method using a single mask level to form node contact openings in a thick insulating layer over the source/drain areas used for the node contact. A doped polysilicon layer is deposited filling the node contact openings and conformally coating the substrate. The polysilicon layer is oxidized to the thick insulating layer but not in the node contact openings. The oxidized portion of the polysilicon layer and the thick insulating layer are removed concurrently in a wet etch leaving free standing pillar-shaped bottom electrodes that also serve as the node contacts. The array of pillar-shaped stacked capacitors are completed by forming a interelectrode dielectric layer on the bottom electrodes and then depositing and patterning another doped polysilicon to form the top electrodes.

19 Claims, 5 Drawing Sheets

HIGH DENSITY DYNAMIC RANDOM ACCESS MEMORY CELL STRUCTURE HAVING A POLYSILICON PILLAR CAPACITOR

BACKGROUND OF THE INVENTION (1) Field of the Invention

This invention relates to a random access memory (DRAM) device and, more particularly, To a structure and a method for fabricating an array of DRAM cells having pillar-shaped stacked capacitors with increased capacitance.

(2) Description of the Prior Art

Dynamic random access memory (DRAM) circuits are used extensively in the electronic industry, and particularly in the computer industry for storing binary information. The DRAM circuit consists of an array of individual memory cells, each cell consisting of a single pass transistor, usually a field effect transistor (FET), and a storage capacitor. Generally, peripheral row decoder circuits are used to select and access the memory cells via the word lines and pass transistors, and column decoder and read/write circuits are used to store and retrieve binary information in the form of charge on the storage capacitor.

In recent years there has been a dramatic increase in the number of memory cells on a DRAM chip. For example, the cell count on a chip is currently about 64 million, and is expected to reach about 256 million cells (bits) by the year 1998. This increase in the number of cells on a DRAM chip is also expected to increase by a factor of 4 about every 3 years for the foreseeable future. This increase in cell density is a result of down sizing of the individual devices with resulting increase in device packing density. The reduction in device size was achieved predominantly by recent advances in high resolution photolithography, directional (anisotropic) plasma etching and other semiconductor technology innovations, such as forming self-aligning structures, shallow implantations, and similar techniques. However, this device down sizing is putting additional demands on the electrical requirements of the semiconductor devices. For example, the rapid increase in the number of cells on the DRAM chip and the corresponding decrease in physical size of the capacitor has made it increasingly difficult to store sufficient charge on the storage capacitor to maintain an acceptable signal-to-noise level. Also, if the value of the capacitance is not maintained, then these volatile storage cells also require more frequent refresh cycles to maintain the charge on the capacitor.

Because the storage capacitor must occupy an area limited by the cell size, so as to accommodate the array of capacitors on the chip, it is necessary to explore alternative methods for increasing the capacitance without increasing the lateral area that the capacitor occupies on the substrate surface.

One proposed method is to form a trench capacitor by etching trenches in the semiconductor substrate, but unfortunately, as the cell area decreases area it becomes increasing difficult to built the FET and the capacitor in the same substrate cell area. An alternative approach is to use stacked capacitors that are formed on the surface over the FET and within the cell area. These stacked capacitors have received considerable interest in recent years because of the variety of ways that its shape can be controlled in the third dimension to increase the capacitance surface area without increasing the area it occupies on the substrate. Many three-dimensional stacked capacitors having various shapes have been reported in the recent literature, such as fin-shaped, conical shaped, fork-shaped, and the likes have been reported in which the bottom electrode is patterned over the cell area. For example, one method for forming a DRAM device having fork-shaped is described by Y. Park, et al, U.S. Pat. No. 5,332,685, in which contact plugs are formed concurrent for the bottom electrodes of the stacked capacitors and the bit line interconnects, and then both the capacitors and bit lines are formed adjacent to each other. This, however, restricts the capacitor area and necessitates the need for design ground rules that limit the cell area.

On future DRAM devices with very high cell density, it becomes increasingly difficult to align and pattern the capacitor electrode over the cell area that provide sufficient increase in capacitance. Therefore, there is still a very strong need in the semiconductor industry to provide alternative methods for making stacked capacitors that occupy even smaller lateral area on the substrate while providing sufficient capacitance to satisfy the above sign-to-noise ratio requirements.

SUMMARY OF THE INVENTION

The present invention is directed to a DRAM cell structure and a method of fabrication of a pillar-shaped capacitor bottom electrode which also forms the electrode connection to the node contact area of the FET in each cell. The invention utilizes the sidewall areas on the pillar-shaped bottom electrode/node connection between the FET gate electrodes and word lines to further increase the capacitor area, and thereby provide more capacitance.

It is therefore a principal object of this invention to provide a dynamic random access memory (DRAM) device having stacked capacitor with pillar-shaped bottom electrodes that extend vertically upward and which also serves as the capacitor node contact.

It is another object of the present invention to fabricate these stacked capacitors using a single masking step to form the bottom electrode, and minimize the ground rule tolerances.

It is still a further object of the invention to provide this new stacked capacitor using a simple manufacturing process with good reliability at low cost.

The method for forming the array of DRAM cells having these new pillar-shaped capacitors begins by forming on said semiconductor substrate, typically composed of a lightly P−doped single crystalline silicon, field oxide areas that surround and electrically isolate device areas in which are built the pass transistors, which are usually N-channel FETs. The FETs gate electrodes are formed by depositing and patterning a first polysilicon layer on the device areas, and forming concurrently and from the same polysilicon layer, word lines elsewhere on the field oxide areas. Typically, the first polysilicon layer is doped with an N-type conductive dopant, such as arsenic (As) or phosphorus (P). Lightly doped source/drain areas are formed in the device areas adjacent to the gate electrodes, usually by ion implanting arsenic ($As^{75}$) or phosphorus ($p^{31}$). Sidewall spacers are then formed on the gate electrodes by depositing and anisotropically etching back an insulating layer, such as a chemically vapor deposited (CVD) silicon oxide ($SiO_2$). A second ion implantation is then used to form the source/drain contact areas for the N-FETs.

Pillar shaped stacked capacitors, by the method of this invention, are now formed over and are electrically connected to form the capacitor node contact to one of the two source/drain contact areas of each field effect transistors in the array of device areas. A first insulating layer is deposited over the patterned first polysilicon layer, and then a much thicker second insulating layer is deposited on the first insulating layer. The first insulating layer is composed of silicon nitride ($Si_3N_4$) and is later used as an etch stop layers and insulating layer. The thick second insulating layer is preferably composed of a CVD silicon oxide or alternatively a borophosphosilicate glass (BPSG). Node contact openings are anisotropically etched in the second and first insulating layers to the FET source/drain contact areas, thereby forming node contact openings having essentially vertical sidewalls. A conformal $N^+$ in situ doped second polysilicon layer is deposited, such as by low pressure CVD (LPCVD), thereby filling the node contact openings, and also forming a uniformly thick second polysilicon layer elsewhere on the second insulating layer. The second polysilicon layer is then thermally oxidized to the top surface of the second insulating layer, while leaving unoxidized the second polysilicon layer in the node contact openings, and thereby forming the pillars-shaped capacitor bottom electrodes having essentially vertical sidewalls and also serving as the capacitor node contacts.

The oxidized second polysilicon layer and second insulating layer are completely removed by subjecting the substrate to an isotropic etch, such as in a solution of hydrofluoric acid and water ($HF/H_2O$), thereby leaving free standing pillar-shaped bottom electrodes contacting the node contact areas of the FETs. The first insulating layer, composed of silicon nitride, serves as the etch stop layer. The sidewalls of the free standing electrodes extending down to the source/drain contact areas between the patterned first polysilicon layer ( gate electrodes and word lines), thereby increase the capacitor surface area.

The array of DRAM cells are now completed by forming on the surface of the pillar-shaped bottom electrodes of the stacked capacitor a thin interelectrode dielectric layer, for example, the dielectric layer can be composed of a silicon oxide-silicon nitride-silicon oxide (ONO). Alternatively, silicon oxide-silicon nitride (ON) layer can be used or other high dielectric contact materials can also be used, such as tantalum pentoxide ($Ta_2O_5$). A third polysilicon layer is then deposited and patterned using conventional photolithographic techniques and plasma etching to form the top capacitor electrodes.

A third insulating layer is deposited to insulate the capacitors and then the bit lines are formed to complete the array of DRAM cells. The third insulating is preferably a low glass transition temperature glass, such as BPSG, which is made planar by annealing. The bit line contact openings are etched in the BPSG to the second source/drain contact areas of each FET in the array, and then a first conducting layer is deposited and plasma etched to form the bit line interconnections, and complete the array of dynamic random access memory (DRAM) cells to first level metal.

BRIEF DESCRIPTION OF THE DRAWINGS

The embodiment of this invention is best understood with reference to the attached drawings which include.

DESCRIPTION OF THE PREFERRED EMBODIMENTS

Now in keeping with the objects of this invention, the method for forming DRAM cells having these pillar shaped stacked capacitor with increased capacitance is covered in detail. The storage capacitors are usually built on P-doped single crystal silicon substrates using N-channel field effect transistors (FET)s as the pass transistor, as is currently used in the manufacture of DRAMs. It should be also be well understood by one skilled in the art that by including additional process steps, in addition to those described in this embodiment, other types of devices can also be included on the DRAM chip, For example, P channel FETs can be formed by providing N-Wells in the P doped substrate and Complementary Metal-Oxide-Semiconductor (CMOS) circuits can also be formed therefrom as is commonly used in the peripheral circuits on the DRAM chip.

Figure 1:
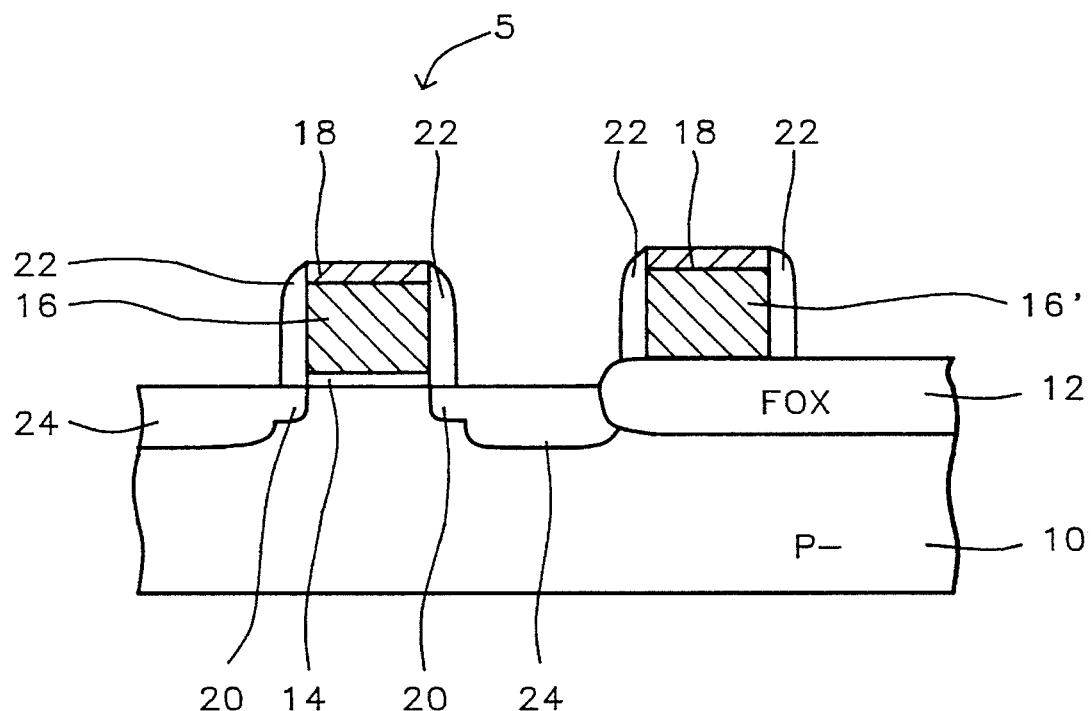
FIG. 1 shows a schematic cross-sectional view of one of the many partially completed DRAM cells on which is formed the pillar-shaped capacitor by the method of this invention.

Referring now to FIG. 1, a cross-sectional view of a portion of a semiconductor substrate 10 is shown having a partially completed DRAM cell with a pass transistor. Typically the pass transistor is an N-channel FET (N-FET) formed on and in the surface in the device area, as also shown in FIG. 1. The preferred substrate 10 is usually composed of a P-type single crystalline silicon having typically a <100> crystallographic orientation. A relatively thick Field OXide (FOX) 12 is then formed around the active device regions which isolate the individual device regions. Typically, the field oxide, only partially shown in FIG. 1, is formed by the LOCal Oxidation of Silicon (LOCOS) method. Although the LOCOS process is not depicted in the FIGS., the method involves depositing a thin silicon oxide (pad oxide) and a silicon nitride layer as an oxidation barrier layer. Conventional photolithographic techniques and etching are then used to remove the $Si_3N_4$ barrier layer in areas where a field oxide is desired while retaining the silicon nitride layer over the desired active devices areas. The silicon substrate is then oxidized to form the field oxide. Usually the field oxide 12 is grown to a thickness of between about 2000 to 5000 Angstroms.

The semiconductor devices are formed next in the active device areas 5 after removing the silicon nitride barrier layer and pad oxide in a wet etch. The most commonly used device for dynamic random access memory (DRAM) is the N-channel field-effect transistor (N-FET). This N-FET device is formed by first growing a thin gate oxide 14 by thermally oxidizing on which is formed the FET gate electrode as shown in FIG. 1. The preferred thickness of the gate oxide 14 is typically between about 50 to 100 Angstroms. The polysilicon /silicide gate electrodes are formed next by depositing a first polysilicon layer 16, appropriately doped N-type and having a metal silicide layer 18 on the surface. Layer 16 and 18 are then patterned using conventional photolitho-graphic techniques and anisotropic plasma etching to form the FET gate electrodes, also labeled 16 in FIG. 1. Concurrently, and from the same layers (16 and 18) the interconnecting word lines over the field oxide areas 12 are also formed (labeled 16' in FIG. 1) that interconnect the gate electrodes 16 to the appropriate peripheral circuits on the DRAM chip. Typically the polysilicon layer is deposited by low pressure chemical vapor deposition using, for example, a reactant gas such as silane ($SiH_4$). The silicide layer is typically formed from a refractory metal, such as tungsten (W). The tungsten silicide ($SiW_2$) can be formed by a variety of methods which include co-evaportion, co-sputtering, but is now typically deposited by chemical vapor deposition using tungsten hexafluoride (WF6) as the reactant gas. The thickness of the polysilicon layer is preferably between about 500 to 2000 Angstroms, and the thickness of the silicide is preferably between about 500 to 2000 Angstroms. Lightly doped self-aligned source/drain areas 20 are formed next adjacent to the gate electrode 16 using the gate electrodes as part of the implant mask, and implanting an N-type dopant species such as arsenic ($As^{75}$) or phosphorus ($^{31}$) in the device areas. For example, a typical implant might consist of phosphorus $^{31}$ at a dose of between 1 E 13 to 10 E 13 atoms/cm$^2$ and an energy of between about 30 to 80 Kev.

After forming the lightly doped source/drain areas 20, sidewall spacers 22 are formed on the sidewalls of the gate electrode 16, and also formed on the word lines 16'. The sidewall spacers 22 are typically formed by depositing a low temperature silicon oxide and anisotropically etching back to the silicon substrate surface. For example, the silicon oxide can be deposited by low pressure chemical vapor deposition (LPCVD) using tetraethoxysilane (TEOS) at a temperature in the range of about 650° to 900° C. and the etch back performed in a low pressure reactive ion etcher (RIE). Another ion implant is carried out to form the heavier doped N$^+$ source/drain contact areas 24, also shown in FIG. 1. Alternatively, the source/drain contacts 24 can be formed at a later process step whereby the dopant is out diffused from an N type doped polysilicon layer.

The remainder of this embodiment relates now more specifically to the method of this invention for fabricating the pillar shaped stacked capacitor, which can further increase the DRAM cell density. The method involves forming a pillar shaped bottom electrodes that extend vertical upward over the FET source/drain contact areas (capacitor node contacts) and requiring very little lateral area in the cell area. The bottom electrode is formed from a single masking level which also forms the capacitor node contact.

Figure 2:
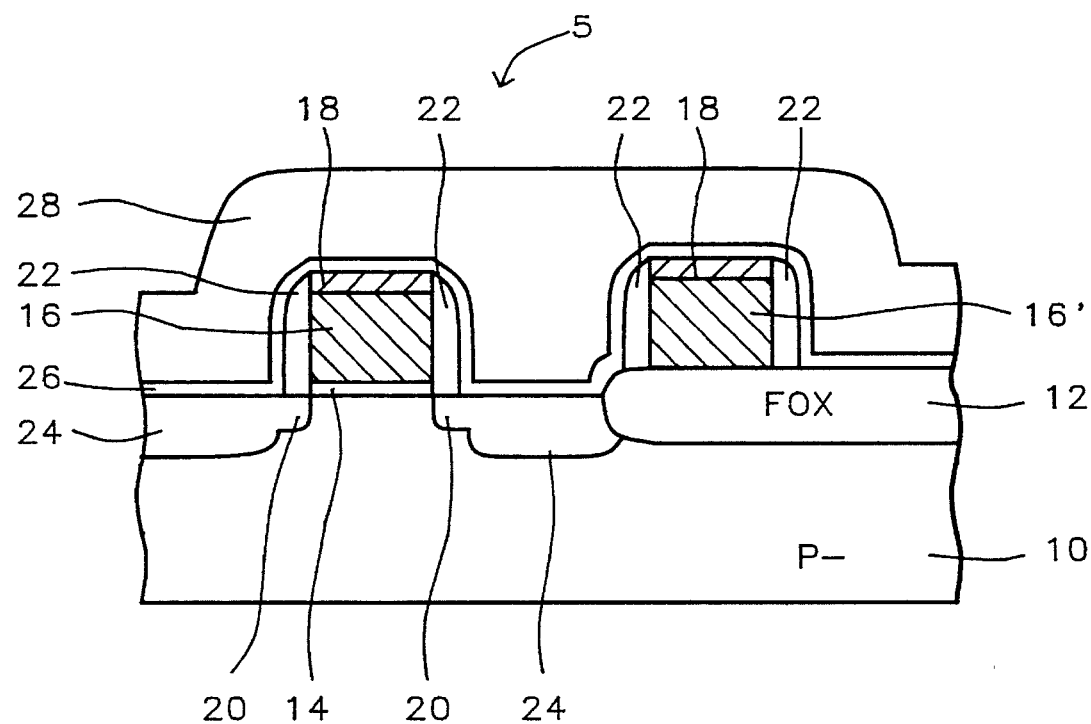
FIGS. 2 through 9 show schematic cross-sectional views for the sequence of process steps of fabricated the pillar-shaped capacitor, by the method of this invention, on the partially completed DRAM cell of FIG. 1

Referring now to FIG. 2, a blanket conformal silicon nitride layer 26 is deposited on the substrate that also covers the gate electrode 16 of the FET and the source drain areas in the device areas 5. The silicon nitride layer 26 is preferably deposited by low pressure chemical vapor deposition (LPCVD) and can be formed by reacting dichlorosilane ($SiCl_2H_2$) and ammonia ($NH_3$), at a deposition temperature of between about 700° to 800° C. The preferred thickness of the silicon nitride layer 26 is between about 500 to 1500 Angstroms. Layer 26 is used later in the process as an etch stop layer, but also functions as a barrier layer against mobile ion contamination, such a sodium (Na).

Referring next to FIG. 2, a much thicker second insulating layer 28, substantially different in composition from the silicon nitride layer 26, is blanket deposited over the silicon nitride layer 26. For example, a LPCVD silicon oxide ($SiO_2$) can be used as is commonly formed by the decomposition of tetraethosiloxane ($Si(OC_2H_5)_4$), also commonly referred to as TEOS silicon oxide. Still another preferred insulating layer is a low glass-transition-temperature glass, such as borophospho-silicate glass (BPSG). The BPSG is also formed by LPCVD using, for example, a reactant gas of silane ($SiH_4$) which is in situ doped with phosphine ($PH_3$) and diborane ($B_2H_6$). The latter insulating layer is capable of being made planar by thermal annealing. The second insulating layer 28 is preferably between about 5000 to 10000 Angstroms thick.

Figure 3:
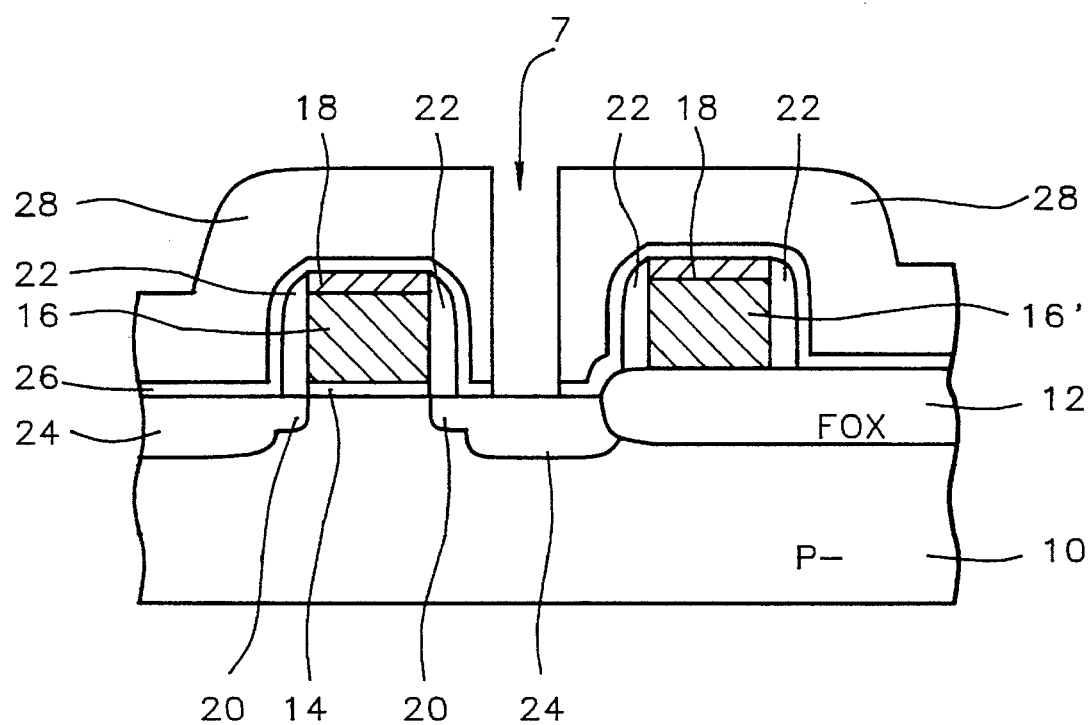

Conventional photolithographic techniques and anisotropic plasma etching are now used to etch the node contact openings, as depicted by 7 in FIG. 3, in the second and first insulating layers 28 and 26, respectively, to one of the two source/drain contact areas 24 of each memory cell FET. The node contact openings 7 are formed having essentially vertical sidewalls, also as depicted in FIG. 3. The contact openings can, for example, be etched in a reactive ion etcher (RIE) or other high plasma density etcher at low pressure. The preferred etch gas is composed of a gas mixture having a low fluorine/carbon ratio, such as trifluoromethane ($CF_3H$) or alternatively a gas mixture of carbon tetrafluoride ($CF_4$) and hydrogen ($H_2$).

Figure 4:
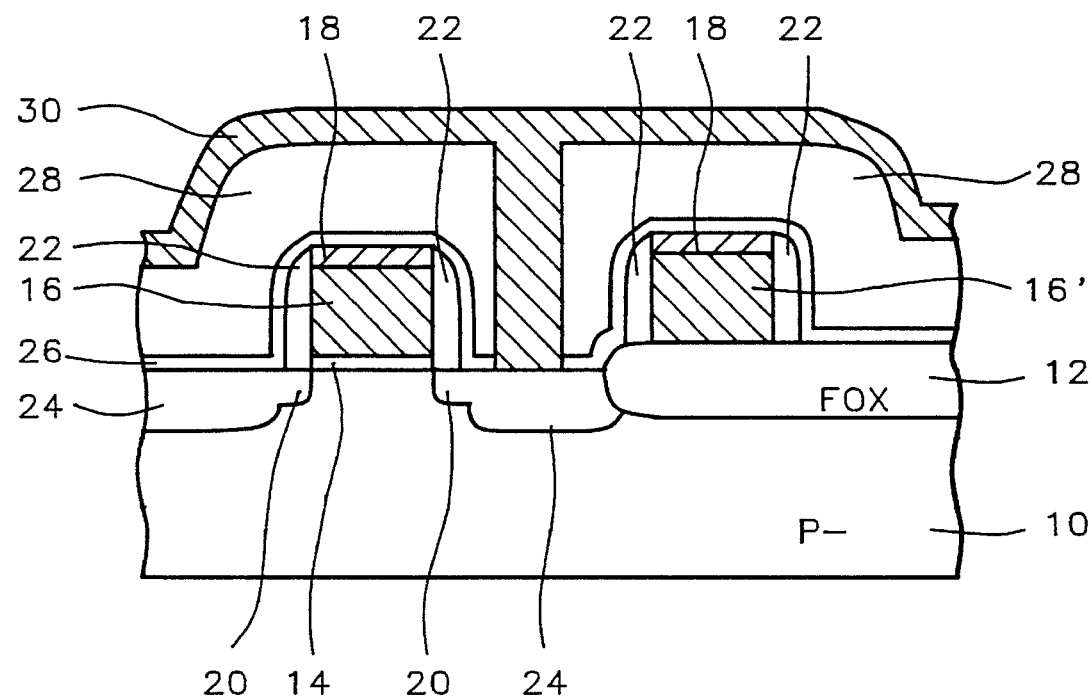

Referring now to FIG. 4, a conformal second polysilicon layer 30 is blanket deposited on the second insulating layer 28, thereby filling the node contact openings 7, and further forming a uniform polysilicon layer 30 over the node contact openings and elsewhere over the insulating layer 28. The layer 30 is preferably deposited using low pressure chemical vapor deposition and a reactant gas, such as silane ($SiH_4$) and further is in-situ doped with an N-type conductive dopant such as phosphorus (P) using a dopant gas such as phosphine ($PH_3$). The preferred thickness of polysilicon layer 30 is between about 1000 to 2000 Angstroms, and is doped to a concentration level of between about 5.0 E 19 to 1.0 E 21 atoms/cm$^3$.

Figure 5:
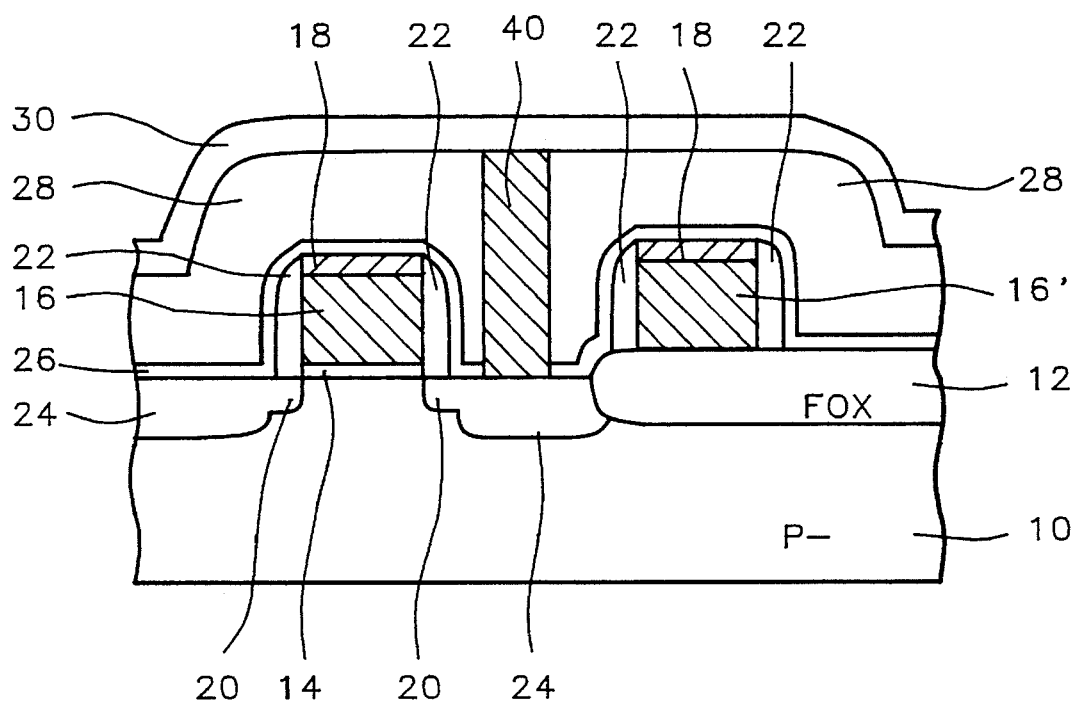

The polysilicon layer 30 is now oxidized to the surface of the insulating layer 28, as depicted in FIG. 5, resulting in the formation of unoxidized doped polysilicon pillars 40 remaining in the node contact openings 7. The polysilicon pillars 40 forms the bottom electrodes for the pillar-shaped stacked capacitor and also provides the capacitor node contacts to the source/drain contact areas 24 of the cell FETs. As is also clearly seen in FIG. 5, the oxidation of layer 30 also results in an array of pillar-shaped bottom electrodes that are electrically isolated from each other, only one of which is shown in FIG. 5. Since the bottom electrode 30 extend vertically upward, the electrodes occupy a very small area on the substrate. This pillar like capacitors will become increasing important in future DRAM cells where the width of the FET gate electrode is expected to be less than a quarter micrometer (um) and the cell area is substantially reduced. The oxidation of polysilicon layer 30 is preferably done in a oxidation furnace using steam oxidation (wet oxidation) for a time sufficient to convert all the polysilicon over the insulating layer 28 to a silicon oxide. By way of example only, if the thickness of polysilicon layer 30 is about 1000 Angstroms, and a wet oxidation is used, then the conversion of the doped polysilicon to oxide can be accomplished at a temperature of about 875° to 900° C. for a time of between about 40 to 60 minutes. Alternatively, the oxidation time can be considerably shortened or the oxidation temperature reduced by using high pressure oxidation, thereby increasing wafer throughput and reducing the processing time. The high pressure oxidation is described in "Silicon Processing for the VLSI Era" Vol. 1, by S. Wolf and R. Tauber, Lattice Press, 1987.

Figure 6:
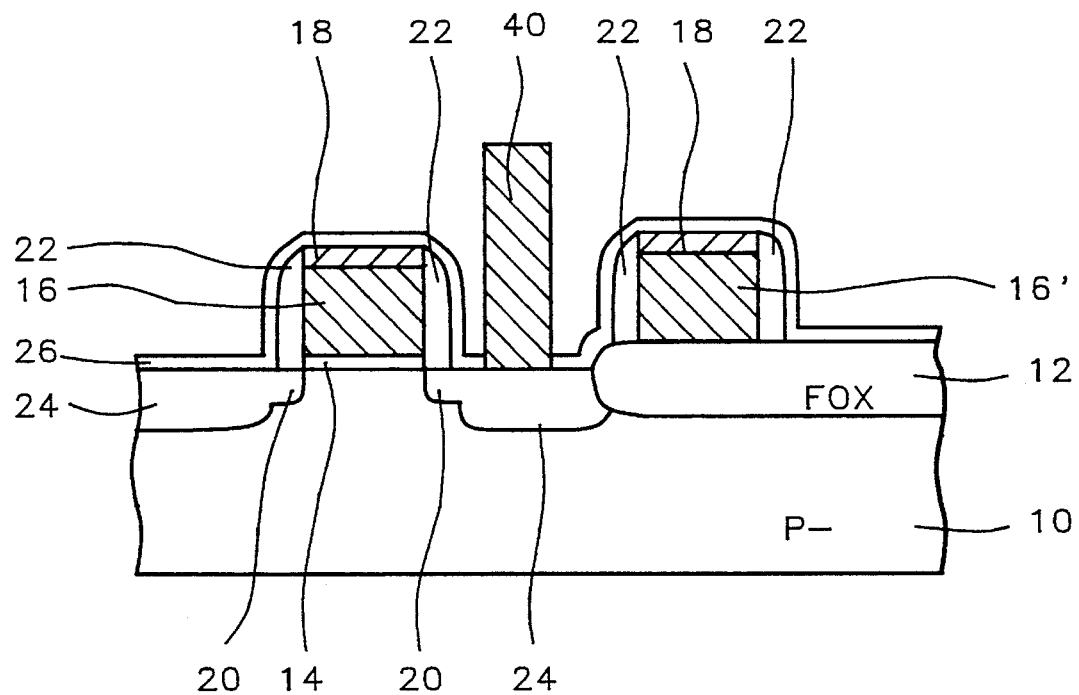

Referring now to FIG. 6, the oxidized polysilicon layer 30 and the second insulating layer 28 (shown in FIG. 5) are removed completely as shown in FIG. 6. This results in a free standing pillar-shaped bottom electrode 40. The oxidized polysilicon layer and oxide layers 26 are preferably removed using an isotropic wet etch, such as a solution of hydrofluoric acid and water (HF/H20). The first insulating layer 26, composed of silicon nitride ($Si3N4$), is virtually unetched in the HF solution providing a etch stop layer, and remaining as an excellent barrier to impurity diffusion, such as sodium.

Figure 7:
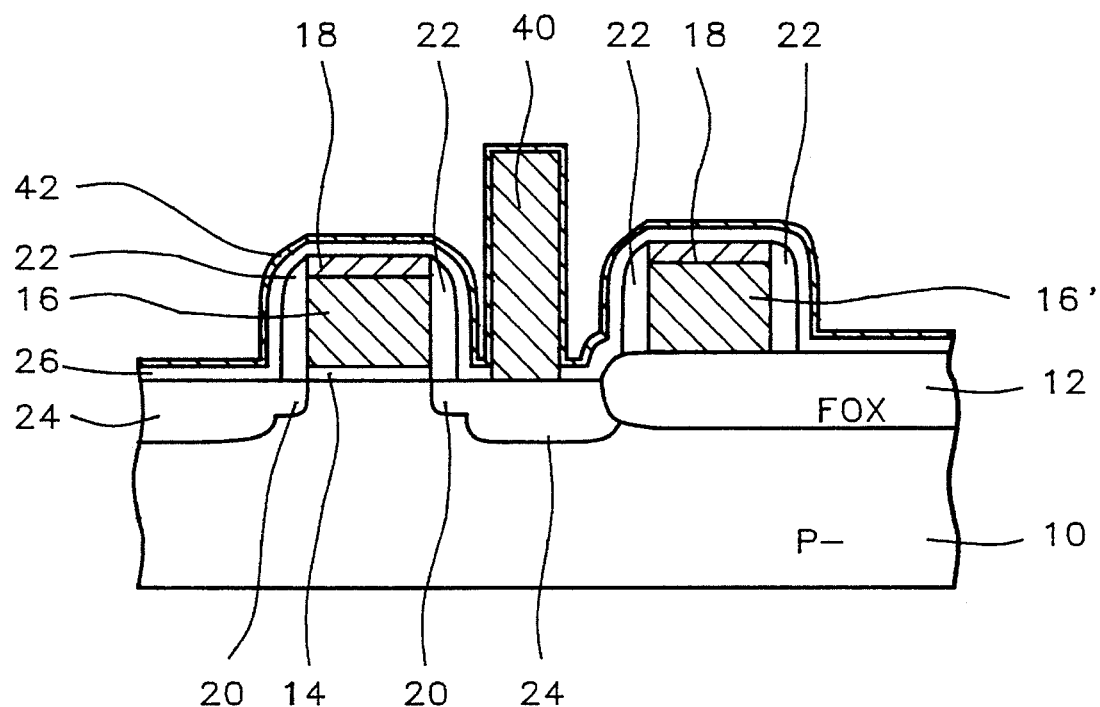
Figure 8:
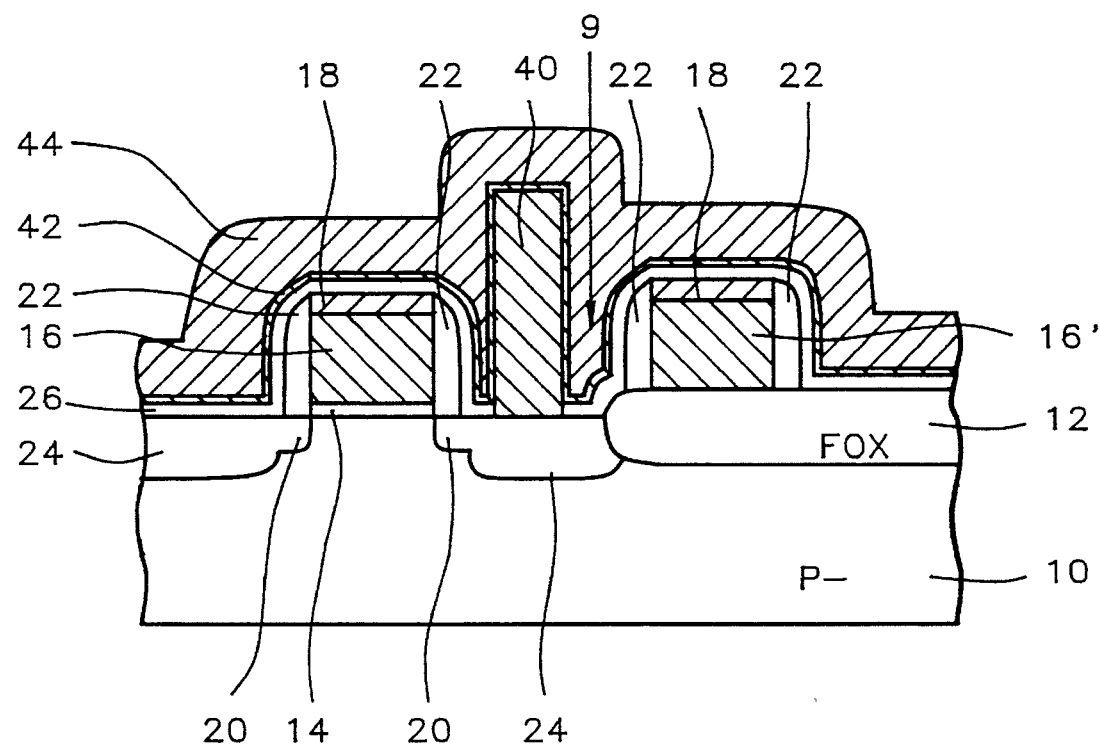
Figure 9:
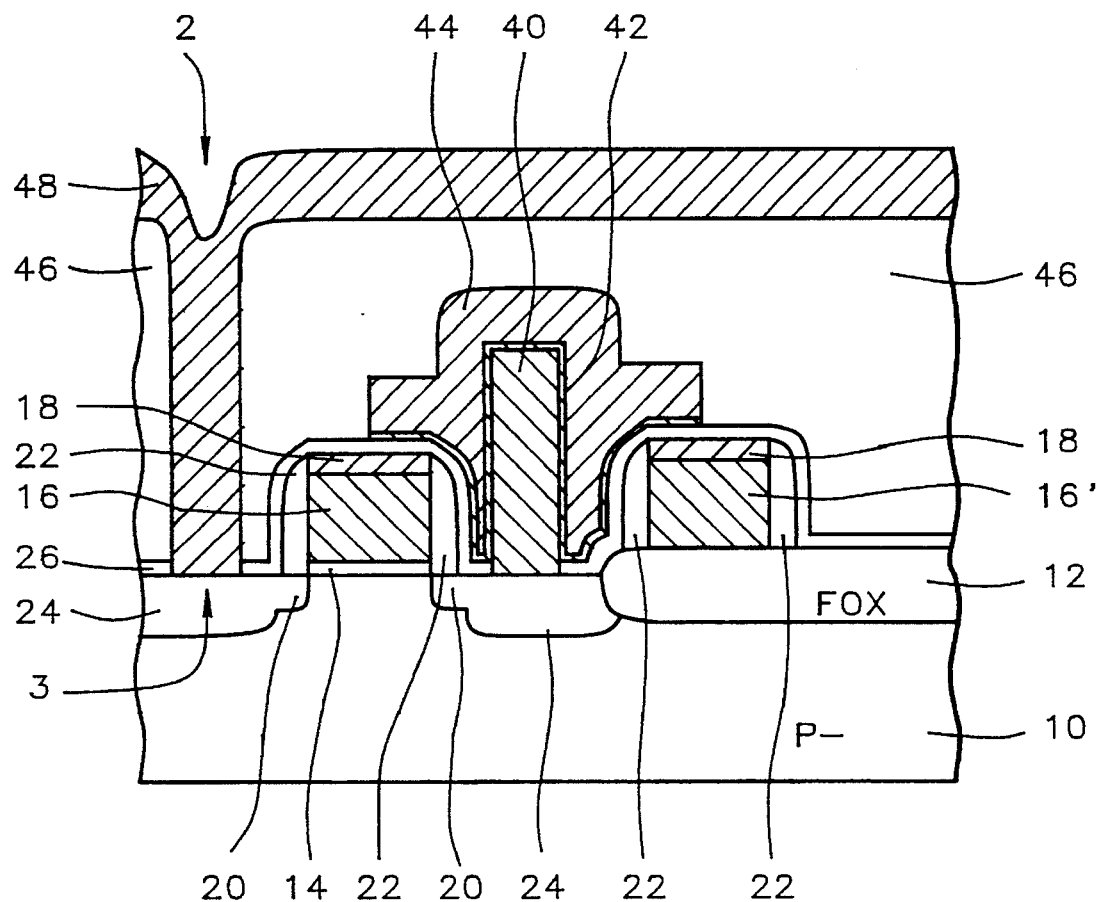

The array of pillar-shaped stacked capacitors for the DRAM cells are now completed, as shown in FIGS. 7 and 8, and the completion of the array of DRAM cells up to the first level metal (bit line metallurgy) is shown in FIG. 9.

As shown in FIG. 7, the process involves forming a capacitor inter-electrode dielectric layer 42 on the surface of the pillar shaped bottom electrodes. The dielectric layer 42 is preferably composed of layers of silicon nitride and silicon oxide ($Si_3N_4/SiO_2$) or layers of silicon oxide, silicon nitride and silicon oxide (ONO). For example, the dielectric layer 42 composed of silicon nitride and silicon oxide can be formed by depositing a silicon nitride layer using low pressure chemical vapor deposition (LPCVD) and a reactive gas mixture of ammonia ($NH_3$) and dichlorosilane ($SiH_2Cl_2$) followed by oxidation of the silicon nitride layer in a wet oxygen at a temperature of about 850° C. for about 10 minutes. The preferred total thickness of the inter-electrode dielectric is between about 30 to 100 Angstroms. Alternatively, of in combination with oxide and/or nitride layers, more exotic high dielectric layers can also be used to enhance the capacitance, such as tantalum pentoxide ($Ta_2O_5$) and further roughening the surface, as suggested in the literature, can also be included.

Referring now to FIG. 8, a third polysilicon layer 44 is deposited on the inter-electrode dielectric layer 42. The layer 44 conformally covers the bottom electrode and forms the top electrode for storage capacitor. Layer 42 also fills the recess (labeled 9 in FIG. 8) between the pillar-shaped bottom electrodes 40 and the gate electrode and word line sidewalls spacers 22, thereby fully utilizing the node contact as part of the pillar-shaped capacitor. The third polysilicon layer 44 is preferably deposited by LPCVD and is in situ doped N-type. The preferred thickness of polysilicon layer 44 is between about 1000 to 3000 Angstroms and is doped with an N-type conductive dopant impurity, such as with phosphorus (P). The preferred concentration of the phosphorus is in the range of between about 5.0 E 19 to 1.0 E 21 atoms/cm$^3$.

The top electrode polysilicon layer 44 is then patterned using conventional photolithographic techniques and plasma etching to complete the stacked capacitor, as shown in FIG. 9. The array of memory cells, only one of which is shown in FIG. 9, are electrically insulated by depositing a fourth insulating layer 46. Typically, the layer 46 is composed of an oxide having a low glass transition temperature, such as borophosphosilicate glass (BPSG), and is then annealed to provide a more planar surface for the next level of interconnection. Typically, the BPSG is deposited to a thickness of between about 3000 to 10000 Angstroms.

Finally, as is also shown in FIG. 9, bit line contact openings, such as contact opening 2, is formed in layer 46, and bit lines 48 are formed to complete the DRAM device up to first level metal. The bit line contact openings are formed using conventional photolithographic techniques and anisotropic plasma etching. For example, reactive ion etching (RIE) or other high plasma density/reduced pressure etches can be used, using a gas mixture such as trifluoromethane ($CHF_3$). The bit lines are formed by depositing and patterning an aluminium or aluminium-copper alloy, providing contacts to the second source/drain area of each of the DRAM memory cells, as indicated by the area label 3 in FIG. 9. Typically a barrier layer (not shown), such as a refractory metal, is commonly deposited prior to the aluminum deposition to prevent spiking (penetration) of aluminum into the shallow source/drain junction in the silicon substrate 10. Alternatively, a refractory metal plug (e.g. tungsten) (also not shown in the Fig) can be used in the bit line contact opening 2 and then the patterned bit line metallurgy formed thereon.

While the invention has been particularly shown and described with reference to the preferred embodiments thereof, it will be understood by those skilled in the art that various changes in form and details may be made without departing from the spirit and scope of the invention. For example, it should be well understood by one skilled in the art that by changing the process and processing sequence the bit line contact and the bit line metallurgy can be formed either prior to or after the stacked capacitor is fabricated as is commonly reported in the literature and practice in the industry, and that both methods are applicable to this invention.

What is claimed is:

1. A method for fabricating stacked storage capacitors on a semiconductor substrate, comprising the steps of:

providing a semiconductor substrate having field oxide areas surrounded and electrically isolated device areas, said device areas having semiconductor devices formed, in part, from a patterned first polysilicon layer, and said devices areas having device contact areas;

depositing a first insulating layer on said substrate and over said patterned first polysilicon layer, depositing a second insulating layer on said first insulating layer;

anisotropically etching node contact openings in said second and first insulating layers to said device contact areas, thereby forming node contact openings having essentially vertical sidewalls for stacked storage capacitor bottom electrodes;

depositing a conformal second polysilicon layer, and thereby filling said node contact openings, and also forming a uniformly thick second polysilicon layer elsewhere on said second insulating layer;

oxidizing by thermal oxidation said second poly-silicon layer to said second insulating layer, and thereby leaving unoxidized polysilicon pillars in said node contact openings having essentially vertical sidewalls;

isotropically etching said oxidized portion of said second polysilicon layer, and by said same isotropic etch, etching selectively said second insulating layer to said first insulating layer leaving free standing polysilicon pillars and thereby forming pillar-shaped bottom electrodes;

forming a capacitor interelectrode dielectric layer on said bottom electrodes, and depositing and patterning a third polysilicon layer, and completing said stacked storage capacitors.

2. The method of claim 1, wherein said first insulating layer is a silicon nitride ($Si_3N_4$) layer having a thickness of between about 500 to 1500 Angstroms.

3. The method of claim 1, wherein said second insulating layer is composed of borophosphosilicate glass (BPSG), and has a thickness of between about 5000 to 10000 Angstroms.

4. The method of claim 1, wherein the thickness of said second polysilicon layer is 1000 to 2000 Angstroms.

5. The method of claim 1, wherein the second polysilicon layer is in situ doped with phosphorus (P) during said polysilicon deposition, and said dopant having a concentration of between about 5.0 E 19 to 1.0 E 21 atoms/cm$^3$.

6. The method of claim 1, wherein said dopant in said third polysilicon layer is doped with phosphorus (P) having a concentration in said third polysilicon layer between about 5.0 E 19 to 1.0 E 21 atoms/cm$^3$.

7. The method of claim 1, wherein the thickness of said interelectrode dielectric layer is composed of silicon oxide-silicon nitride-silicon oxide (ONO), having a total thickness of between about 30 to 100 Angstroms.

8. The method of claim 1, wherein the thickness of said third polysilicon layer is between about 1000 to 3000 Angstroms.

9. The method of claim 1, wherein said patterned first polysilicon form the gate electrodes and word lines for field effect transistors (FET) in said device areas, and said FETs and said storage capacitors having pillar shaped bottom electrodes form an array of DRAM cells.

10. The method of claim 1, wherein said pillar shaped bottom electrodes lie between and within said patterned first polysilicon layer, and thereby provide increased capacitance for said storage capacitors.

11. A method for fabricating an array of dynamic random access memory (DRAM) cells on a semiconductor substrate, comprising the step of:

forming on said semiconductor substrate an array device areas, surrounded and electrically isolated by field oxide areas;

depositing and patterning a first polysilicon layer forming gate electrodes for field effect transistors in said device areas and forming word lines elsewhere on said substrate; and forming lightly doped source/drain areas in said device areas adjacent to said gate electrodes;

forming sidewall spacers on said gate electrodes; and forming stacked storage capacitors contacting one of source/drain areas of each said field effect transistor in said array of device areas by;

depositing a first insulating layer on said substrate and over said patterned first polysilicon layer, depositing a second insulating layer on said first insulating layer, anisotropically etching node contact openings in said second and first insulating layers to said device contact areas, thereby forming node contact openings having essentially vertical sidewalls for stacked storage capacitor bottom electrodes, depositing a conformal second polysilicon layer, and thereby filling said node contact openings, and also forming a uniformly thick second polysilicon layer elsewhere on said second insulating layer, oxidizing by thermal oxidation said second polysilicon layer to said second insulating layer, and thereby leaving unoxidized polysilicon pillars in said node contact openings having essentially vertical sidewalls, isotropically etching said oxidized portion of said second polysilicon layer, and by said same isotropic etch, etching selectively said second insulating layer to said first insulating layer leaving free standing polysilicon pillars and thereby forming pillar-shaped bottom electrodes, forming a capacitor interelectrode dielectric layer on said bottom electrodes, and depositing and patterning a third polysilicon layer, and forming the top electrodes for said stacked storage capacitors, depositing a third insulating layer, forming bit line contact openings in said third insulating layer and said first insulating layer to the other one of said source/drain contact areas of each said field effect transistor in said device areas;

depositing and patterning a conducting layer and forming an array of bit lines on said third insulating layer and in said bit line contact openings, and thereby completing said dynamic random access memory (DRAM) device having an array of memory cells.

12. The method of claim 11, wherein said first insulating layer is a silicon nitride ($Si_3N_4$) layer having a thickness of between about 500 to 1500 Angstroms.

13. The method of claim 11, wherein said second insulating layer is composed of borophosphosilicate glass (BPSG), and has a thickness of between about 5000 to 10000 Angstroms.

14. The method of claim 11, wherein the thickness of said second polysilicon layer is 1000 to 2000 Angstroms.

15. The method of claim 11, wherein the second polysilicon layer is in situ doped with phosphorus (P) during said polysilicon deposition, said dopant having a concentration of between about 5.0 E 19 to 1.0 E 21 atoms/$cm^3$.

16. The method of claim 11, wherein said third polysilicon layer is doped with phosphorus (P) having a concentration in said third polysilicon layer between about 5.0 E 19 to 1.0 E 21 atoms/$cm^3$.

17. The method of claim 11, wherein the thickness of said interelectrode dielectric layer is composed of silicon oxide-silicon nitride-silicon oxide (ONO), having a total thickness of between about 30 to 100 Angstroms.

18. The method of claim 11, wherein the thickness of said third polysilicon layer is between about 1000 to 3000 Angstroms.

19. The method of claim 11, wherein said pillar shaped bottom electrodes lie between and within said patterned first polysilicon layer, and thereby provide increased capacitance for said storage capacitors.

* * * * *